US00RE36603E

United States Patent [19]

Pohl et al.

[11] E Patent Number: Re. 36,603

[45] Reissued Date of Patent: Mar. 7, 2000

[54] DISTANCE-CONTROLLED TUNNELING TRANSDUCER AND DIRECT ACCESS STORAGE UNIT EMPLOYING THE TRANSDUCER

[75] Inventors: Wolfgang D. Pohl, Adliswil, Switzerland; Conrad W. Schneiker, Tucson, Ariz.

[73] Assignee: International Business Machines Corp., Armonk, N.Y.

[21] Appl. No.: 08/700,090

[22] Filed: Aug. 20, 1996

Related U.S. Patent Documents

Reissue of:

[64] Patent No.: 5,210,714
Issued: May 11, 1993
Appl. No.: 07/674,264
Filed: Mar. 25, 1991

U.S. Applications:

[60] Continuation of application No. 08/440,597, May 11, 1995, abandoned, which is a division of application No. 07/421,207, Oct. 13, 1989, Pat. No. 5,043,577.

[51] Int. Cl.[7] ..... G11C 11/00; G01N 23/00; G11B 9/00

[52] U.S. Cl. ..... 365/151; 365/153; 365/118; 365/217; 250/306; 369/126

[58] Field of Search ..... 365/217, 118, 365/151, 153; 250/306, 307; 369/126

[56] References Cited

U.S. PATENT DOCUMENTS

| | | | |
|---|---|---|---|
| 4,668,865 | 5/1987 | Gimzewski et al. | 250/306 |
| 4,806,755 | 2/1989 | Duerig et al. | 250/306 |
| 4,831,614 | 5/1989 | Duerig et al. | 369/101 |
| 4,906,840 | 3/1990 | Zdeblick et al. | 250/306 |
| 4,912,822 | 4/1990 | Zdeblik et al. | 250/307 |
| 4,998,016 | 3/1991 | Nose et al. | 250/306 |
| 5,043,577 | 8/1991 | Pohl et al. | 250/305 |
| 5,053,995 | 10/1991 | Kajimura et al. | 365/151 |
| 5,150,392 | 9/1992 | Hohn et al. | 378/34 |

FOREIGN PATENT DOCUMENTS

| | | | |
|---|---|---|---|
| 2-260668 | 10/1990 | Japan | 365/215 |
| 1536441 | 1/1990 | U.S.S.R. | 365/157 |
| 91/00592 | 1/1991 | WIPO | 365/157 |

*Primary Examiner*—Andrew Q. Tran
*Attorney, Agent, or Firm*—Gunster, Yoakley, Valdes-Fauli & Stewart, P.A.

[57] ABSTRACT

A distance-controlled tunneling transducer comprises a plurality of tunnel tips arranged in an array at a tunneling distance from an electrically conductive surface of a storage medium. Each tip is attached to a respective cantilever beam permitting the distance between each tip and the surface to be individually pre-adjusted electrostatically. Arranged in juxtaposition with each cantilever beam is an active control circuit for adjusting the tip-to-surface distance during operation of the storage unit, thus preventing crashes of the associated tip into possible asperities on the surface of the recording medium. Each control circuit is designed such that its operating voltage concurrently serves to pre-adjust its associated cantilever beam and to maintain the tip-to-surface distance essentially constant.

8 Claims, 4 Drawing Sheets

DISTANCE-CONTROLLED TUNNELING TRANSDUCER AND DIRECT ACCESS STORAGE UNIT EMPLOYING THE TRANSDUCER

Matter enclosed in heavy brackets [ ] appears in the original patent but forms no part of this reissue specification; matter printed in italics indicates the additions made by reissue.

This application *is a continuation of application Ser. No. 08/440,597, filed May 11, 1995, now abandoned, which was filed as a reissue of U.S. Pat. No. 5,210,714, which issued May 11, 1993, from application Ser. No. 07/674,264, filed Mar. 25, 1991, which* is a division of application Ser. No. 07/421,207, filed Oct. 13, 1989, now U.S. Pat. No. 5,043, 577.

BACKGROUND OF THE INVENTION

The present invention relates to a distance-controlled tunneling transducer for use in a direct storage unit, having a plurality of tunnel tips arranged facing a recording medium. In particular the invention teaches improved gap control means for implementation in micromechanical techniques. The invention is also applicable to low-voltage field-emission environments where the gap dimension is somewhat larger in the tunneling regime. Therefore, where in the following description reference is made to tunneling phenomena, those skilled in the art will be able to easily apply what is said to field-emission phenomena as well.

In the tunneling regime, the tip/surface distance typically is less than 2 nm, and in the field-emission environment, that distance is considered to be on the order of 20 nm. Small local deviations from planarity of the surface of the recording medium, say on the order of tenths of a nanometer, may result in relatively large changes of the tip current, inparticular in the tunnel regime, where the dependence of the tunneling current on the tip-to-surface distance is exponential. Because of the fact that the operating distances in tunneling as well in in field-emission environments are so small, it may even happen that the tip crashes into a surface it and thus suffers damage, unless some measure is taken to maintain the tip-to-surface distance essentially constant. In conventional tunneling microscopes, this problem is solved by means of a feedback loop operating from the tip distance above the surface, with the aim of keeping the tip current constant. It will be obvious to those skilled in the art that in view of the relatively large velocity with which surface asperities may be encountered as the tip scans across the surface of the recording medium, and because of the possibly abrupt change in tip-to-surface distance, a very fast response of the feedback loop is required.

Recently, direct access storage devices have been proposed which operate on the principle of the scanning tunneling microscope. The basic reference in this area is EP A-0 247 219. The reference teaches a storage unit comprising an array of tunnel tips arranged at a tunnel distance from the surface of a recording medium which is capable of permitting digital information to be written or read the variations of the tunneling current. The tunnel is maintained by means of a feedback loop, and the idea of integrating the control circuitry of that feedback loop on the tunnel tip array is mentioned. No details of the circuitry nor of the way the integration can be achieved are, however, given.

A scanning tunneling microscope realized in micromechanical techniques is disclosed in U.S. Pat. No. 4,520,570. A semiconductor chip has slots etched into it in a pattern resulting in a plurality of tunnel tips to be formed that are hinged by stripes of semiconductor material to the main body of the chip. Again in this reference, an area is provided on the semiconductor chip to contain control circuitry associated with the tunnel tip, in casu a transistor acing as an impedance transformer.

While it is acknowledged that the idea has occurred to integrate the tunnel tip feedback loop into the semiconductor chip on which the tunnel tip is formed, it has turned out that conventional control circuitry for scanning tunneling microscope and field emission microscope applications is by far too complex and, hence, too bulky to be installed on the semiconductor chip if the chip is to carry a plurality of tips arranged in a small array.

As a possible alternative, one may requires that both the array of tips and the use of the recording medium be sufficiently flat, for instance within 0.1 nm over the area to be scanned, to allow for global gap width control averaging over the currents of all tips. Such a requirement would, however, impose undesirable constraints with regard to precision of manufacturing and alignment, as well as to the choice of materials for the recording medium.

SUMMARY OF THE INVENTION

A primary object of the present invention is to solve this problem by foregoing the idea of perfect feedback regulation, i.e. with zero error. Instead, an open loop circuit is provided which compensates for distance variations though less completely, but which is sufficiently simple to be easily integrated into a multiple-tip scanner head. The achievable reduction in distance variation as result of variation of the tip-to-surface distance typically is a factor of from 30 to greater 100. The result is relaxed manufacturing tolerance requirements with regard to flatness of the recording medium to values that can easily be maintained.

Details of an embodiment of the invention will hereafter be described by way of example having reference to the attached drawings.

DETAILED DESCRIPTION

While the invention will be described in connection with the electrostatic deflection of a cantilever beam as conventionally used in micromechanical arrays, it will be obvious to those skilled in the art that the invention is also applicable to piezoceramic scanners.

Figure 1:
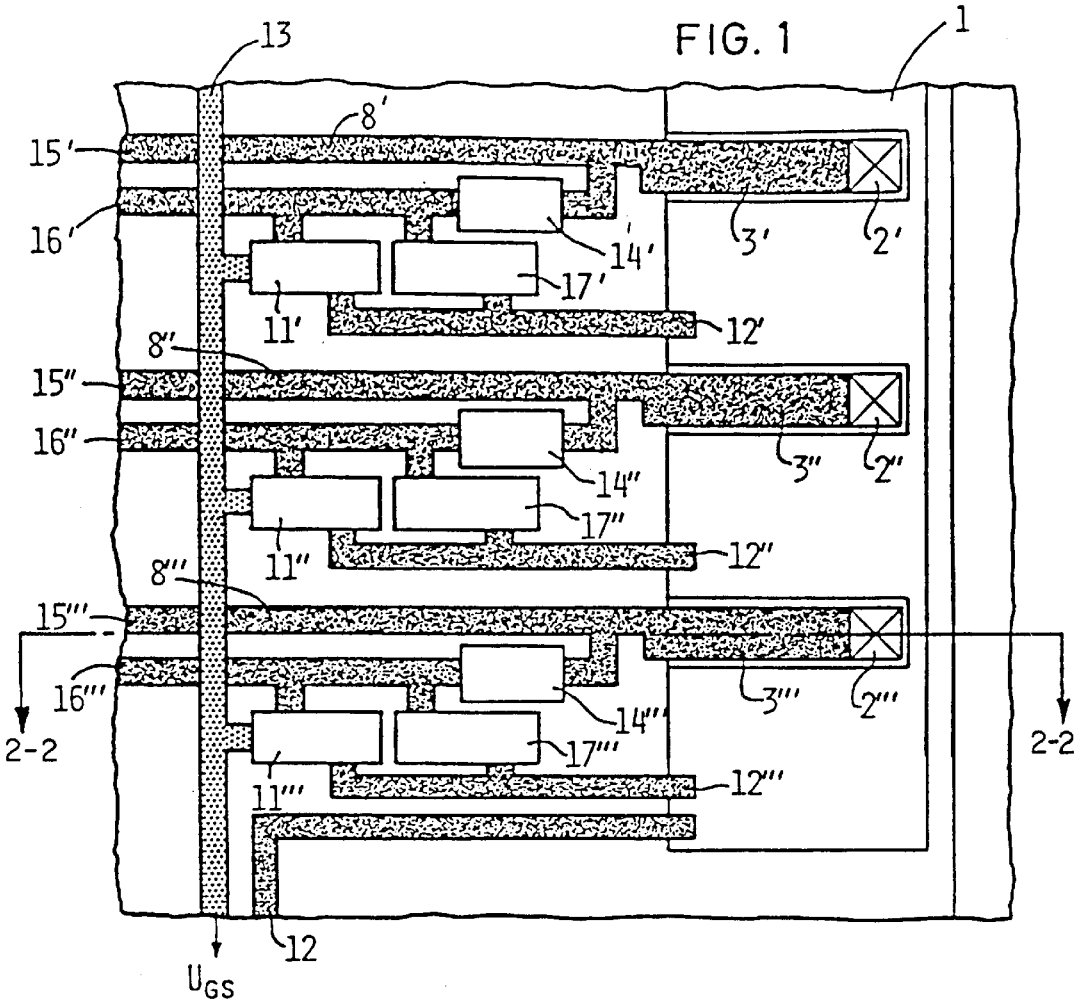
FIG. 1 is a top plan view onto a section of an array of tunnel tips.
Figure 2:
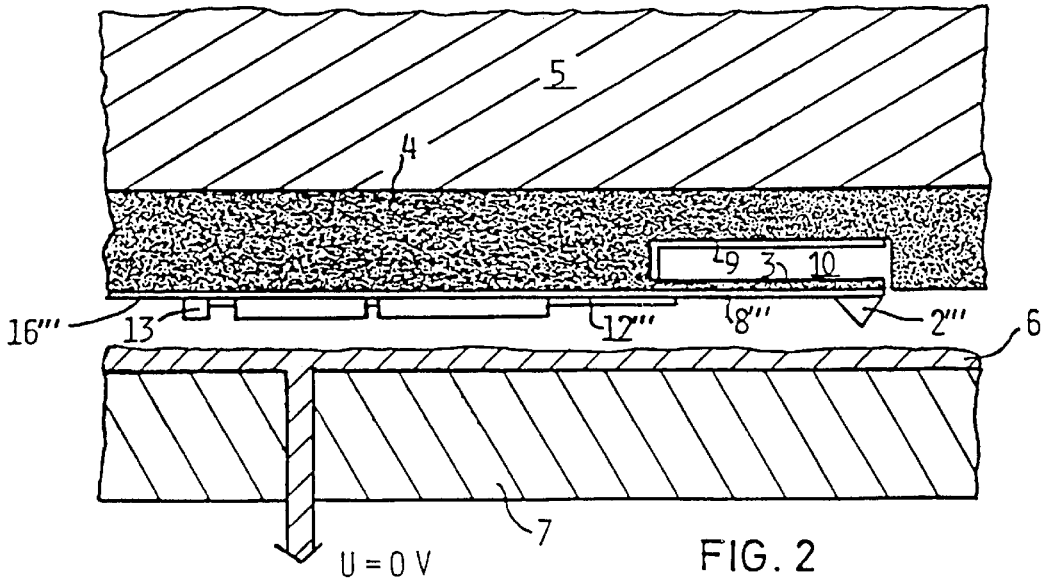
FIG. 2 is an enlarged cross-section of the tunnel region along line A—A of FIG. 1.

FIGS. 1 and 2 show the contemplated arrangement of the elements of the transducer in accordance with the invention in a semi-schematical way. Referring to FIG. 1, there is shown a section of the transducer 1 with three tunnel tips 2', 2", 2"' out of a plurality of tunnel tips (or field-emission tips) arranged in an array. The tunnel tips are attached to cantilever beams 3',3",3"' respectively which are formed, e.g. by etching from body 4, FIG. 2, of transducer 1 as an integral part thereof. Transducer 1 is mounted to a conventional xyz-drive 5 which provides lateral deflection as well as coarse approach and adjustment of the average distance between tunnel tip 2 and the oppositely disposed surface 6, by keeping the total tunneling current essentially constant. Surface 6 may actually be the surface of a sample to be inspected by means of a scanning tunneling. However, since the present invention is intended particularly for use in with information storage devices, for the purposes of this description surface 6 will be assumed to be the surface of a recording medium 7. The medium 7 may comprise, for example, a magnetizable material. Since the funnel effect requires the surface opposite by the tunnel tip to be electrically conductive, any nonconductive materialized as the recording medium may be provided with a very thin conductive coating.

Each of the cantilever beams can be deflected electrostatically by application of voltages $U_1$ and $U_2$, respectively, between an electrode 8', 8", 8"' on cantilever beam 3', 3", 3"' and a counter-electrode 9 at the bottom of the recess 10 etched into body 4 underneath each cantilever beam, and between the electrode 8 and the surface 6 of the recording medium 7. This deflection is used to control the width of the tip-to-surface gap, in particular during operation in the tunneling mode.

Figure 3:
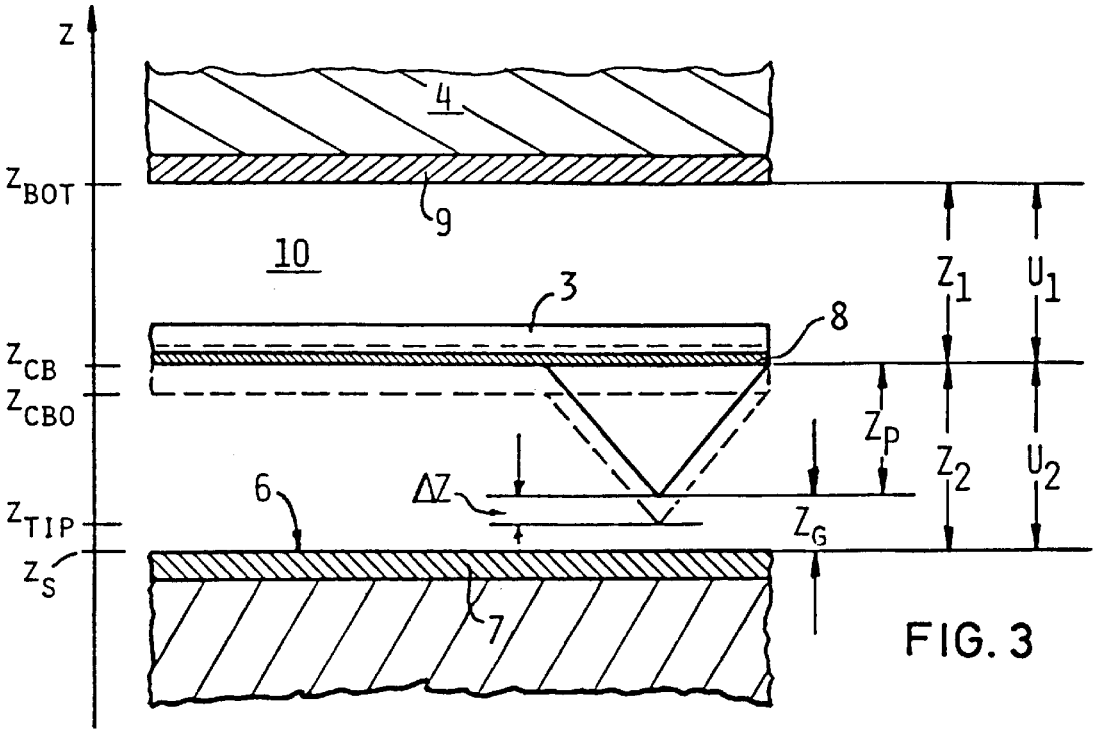
FIG. 3 is a schematic representation of the tunnel tip, showing the different positions of the cantilever beam during operation.

Arranged on body 4 of transducer 1 are electric circuit elements 11 through 17 which eve to control the deflection of the cantilever beams 3 in the array and to create the tunneling currents across the gaps between the tuned tips and the surface 6 of the common recording medium 7. FIG. 3 is an enlargement of a portion of FIG. 2 to better show the relevant z-coordinates, distances and voltages. In its home position, i.e., in a voltageless state, cantilever beam 3 assumes a position designated in FIG. 3 as $z_{CB}$ a distance $Z_1$ from counter-electrode 9 the surface of the counter-electrode being located at $Z_{BOT}$, and at a distance $Z_2$ from the surface 6 of recording medium 7 which is located at $Z_S$. In the home position of tunnel tip 2, and considering that the tip has a height dimension $Z_P$, its apex is located at $Z_{TIP}$, i.e. a gap width $Z_G$ away from surface 6.

Application of voltages $U_1$, $U_2$ between electrode 8 on cantilever beam 3 and surface 6 causes the cantilever beam 3 to deflect by a distance $\Delta Z$ to a new position $Z_{CB0}$. The voltages required for deflecting cantilever beam 3 are provided by circuitry comprising a field-effect transistor 11 connected between supply line 12 and electrode 8 on cantilever beam 3. Field-effect transistor 11 acts as a constant current source which is set by means of a the line 13. Counter electrode 9 is part of supply line 12 and is at a constant potential $U_0$. Hence the deflection voltages are $U_1=U_0-U_1$, $U_2=U_t$.

When tunnel tip 2 is far from surface 6, i.e. gap $Z_G$ is large, then the resistance across the tunnel gap $R_1\rightarrow\infty$, $U_1\rightarrow 0$, $U_2\rightarrow U_0$. As cantilever beam 3 becomes most deflected towards surface 6 of recording medium 7: $\Delta Z_{max}\equiv \tilde{B}(U_0/Z_P)^2$, where it is assumed that $Z_G<Z_P$. The term B will be explained below.

When tip 2 gets closer to surface 6 so that tunneling current $I_t$ becomes finite, i.e. larger than the avoidable leakage current of field-effect transistor 11, which is typically <100 pA, then the voltage ratio $U_1/U_2$ increases resulting in a retraction of cantilever beam 3. Thus, any increment in $z_3$, that is, for example, some surface roughness, produces a much smaller decrease of $Z_G$.

Figure 4:
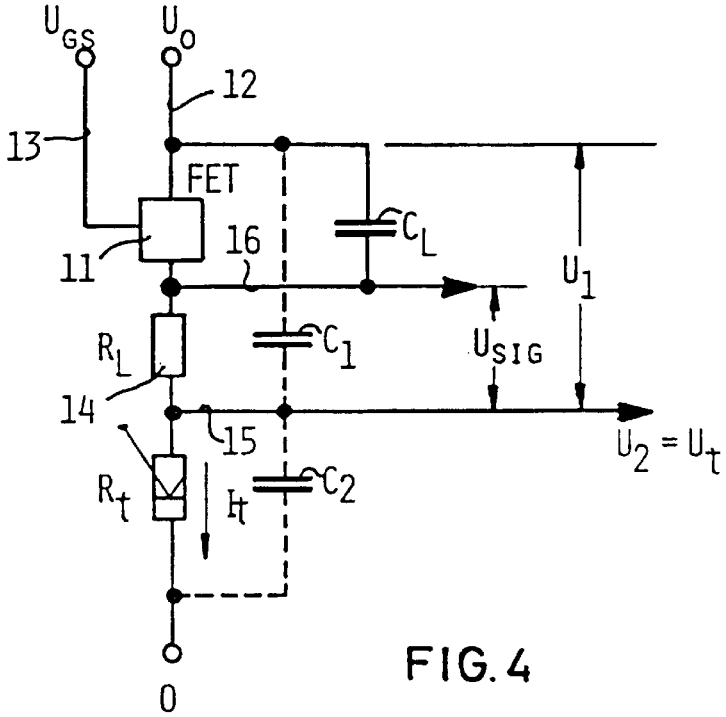
FIG. 4 is a circuit diagram of the circuitry associated with the tunnel tip.

FIG. 4 is a circuit diagram a the unit cell, viz. for the electronic circuitry associated with one cantilever beam 3. The tunneling current $I_t$ flowing across the tip-to-surface gap, i.e. through the tunnel resistance $R_t$, is monitored by means of a load resistance 14 ($R_L$) which is chosen such that $R_L<R_t$ under operating conditions. The signal $U_{SIG}$ occurring across load resistance 14 is provided via lines 15 and 16. A load capacitance 17 ($C_L$) introduces some inertia into the compensation process characterized by a time constant $\tau_L=R_tC_L$. Hence, information-carrying variations passing tip 2 within a time shorter than the time constant $\tau_L$ are not compensated, giving rise to a large variation in $U_{SIG}$. The performance of the scheme is described by the $Z_G(Z_S)$ characteristic quasi-static conditions (with reference to $\tau_L$). Therefore, $R_L$ and $C_L$ are ignored in this part of the discussion. Further ignored are the stray capacitance $C_1$ between cantilever beam 3 and supply line 12, and the stray capacitance $C_2$ between cantilever beam 3 and counterelectrode 9, because they are negligible compared to load capacitance $C_L$. Without loss of generality, it can be that $Z_{CB0}=0$, hence, $Z_S<0$. Under these conditions $Z_G(Z_S)$ can be derived from the following set of relations:

$$Z_G=-Z_P-Z_S+\Delta Z \quad [1]$$

$$\Delta Z\cong\tilde{B}[(U_1/Z_1)^2-(U_2/Z_2)^2] \quad [2]$$

$$Z_1=Z_{BOT}-\Delta Z \quad [3]$$

$$Z_2=-Z_S+\Delta Z \quad [4]$$

$$U_1=U_0-U_2 \quad [5]$$

$$U_2=U_1=I_1R_1 \quad [6]$$

$$R_1=R_{t0}e^{xZ_G} \quad [7]$$

$$\tilde{B}=\epsilon\epsilon_0 l^4/4Et^3, \quad [8]$$

with $\epsilon\epsilon_0$=dielectric constant (≅0,8 pF/m), E=elastic modulus, l=length and $\tilde{t}$=thickness of the cantilever beam 3, respectively, and $R_{t0}\cong 40$ kω, $\kappa\cong 10^{10}$ $m^{-1}$.

Equations [1] through [7] cannot be solved analytically for $Z_G$ but the derivative can be determined easily:

$$\frac{dZ_G}{dz_s}=-1+\left(\frac{\partial\Delta z\partial U_1}{\partial U_1\partial U_2}+\frac{\partial\Delta z}{\partial U_2}\right)\partial U_2\partial R_1\frac{dZ_G}{\partial R_1\partial Z_G dz_S}=-1+A\frac{dZ_G}{dz_S} \quad [9]$$

hence $$\frac{dZ_G}{dz_S}=\frac{1}{A-1}. \quad [10]$$

With the parameters chosen below, and at realistic operating conditions in the tunneling mode, $Z_G<\Delta-Z<Z_{1,2}$ such that $Z_1\cong z_{BOT}$ and $Z_2\cong Z_p$; further $U_1-\cong U_0<U_2=U_t$, the quantity A becomes:

$$A\cong-2\kappa\tilde{B}U_0U_t/Z_{BOT}^2 \quad [11]$$

For a numerical calculation, the following values have proven appropriate: $\epsilon=1$; $\epsilon_0=8\times10^{-12}$ F/m; 1=200 μm; t=2

$\mu$m; E=$10^{11}$ N/m$^2$ (silicon, quartz); $z_{BOT}=Z_P=3$ $\mu$m. With these values and a projected width w=200 $\mu$m of the cantilever beam, a spring constant of C*=4,5 N/m results which is sufficient to prevent mechanical instabilities due to interfacial forces. The first elastic resonance of the cantilever beam occurs at >100 kHz which is much better than in present-day scanning tunneling microscopes. The deflection parameter becomes:

$$\tilde{B}=0{,}4\times10^{-20}\ \mathrm{m}^3/\mathrm{V}^2 \qquad [12]$$

Assuming operation at $U_t$=0.5 V, then A≅100. Since A>1, one may ignore the 1 in the denominator of equation [10], hence $$\frac{dZ_G}{dz_S} = A^{-1} = 0.01. \qquad [13]$$

Equation [13] means that a 10 nm variation in surface height results in no more than a 0.1 nm on change in tunnel gap width.

For very small and very large tunnel gap widths, the above-given set of equations is easily solved for $z_S(Z_G)$. There is no reduction effect to be expected:

$$z_S = \begin{cases} \Delta Z_{max} - Z_P - Z_G \\ -\Delta Z_{max}[Z_N(Z_P + Z_G)]^2 - Z_P = Z_G \text{ for } Z_G \rightarrow \\ -Z_P - Z_G \end{cases} \qquad [14]$$

$$\begin{cases} 0 & \text{(a)} \\ \text{large but} \ll Z_P & \text{(b)} \\ \infty & \text{(c)} \end{cases}$$

Figure 5:
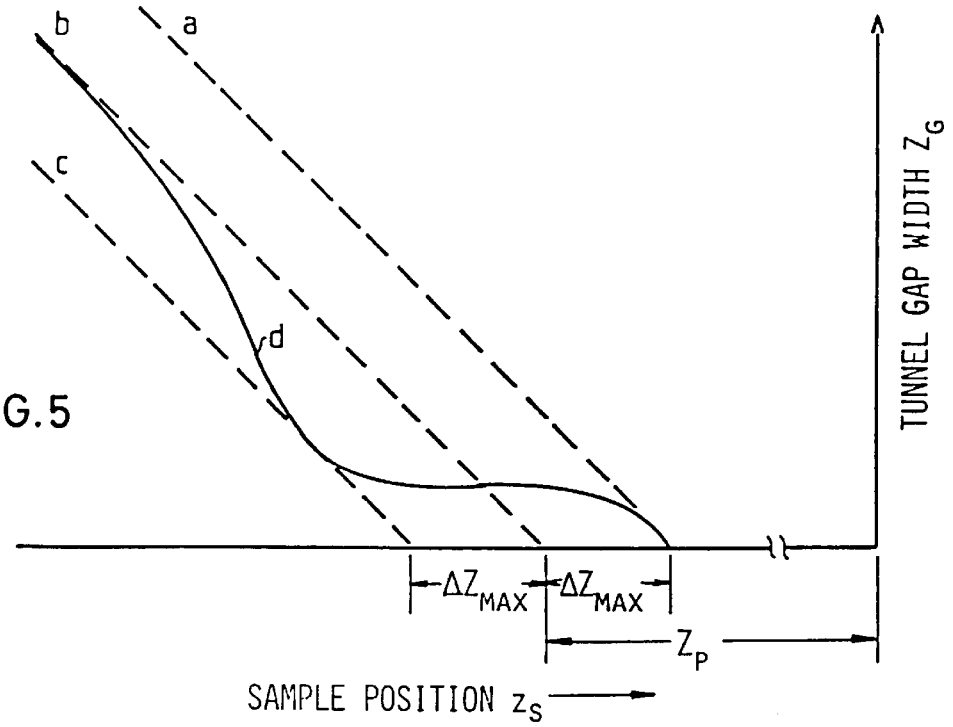
FIG. 5 is a graph used in the determination of the operating point of the circuitry of FIG. 4.

FIG. 5 depicts the linear and almost linear relations calculated in accordance with Equation [14]. The dashed lines designated a, b, and c, having a slope of −1, and being mutually parallel-displaced by the amounts $\Delta Z_{max}$, and 2 $\Delta Z_{max}$, respectively, arc the calculated asymptotes to the curve $z_S(Z_G)$ represented in a semi-quantitative way by the solid curve d. The operating point is to be chosen on the horizontal plateau (of the width 2 $\Delta Z_{max}$) between dashed lines a and b. Since the voltage $U_1$ is generally kept small, the operating point will preferably be chosen near the right-hand end of the plateau.

For this purpose, the tunneling current from a few selected cells can be fed into a regular feedback control circuit. This measure assure that the overall system settles approximately at the operating points of the individual elements. The quantitative behavior of the response curve may be obtained by numerical integration of Equation [13].The initial setting of the parameters may be chosen as follows:

$$Z_G=O,\ R_t=R_{t0},\ U_2=I_tR_{t0}<U_1=U_0,\ \Delta Z=\tilde{B}(U_0/Z_p)^2,\ z_s=\Delta Z.$$

Figure 6:
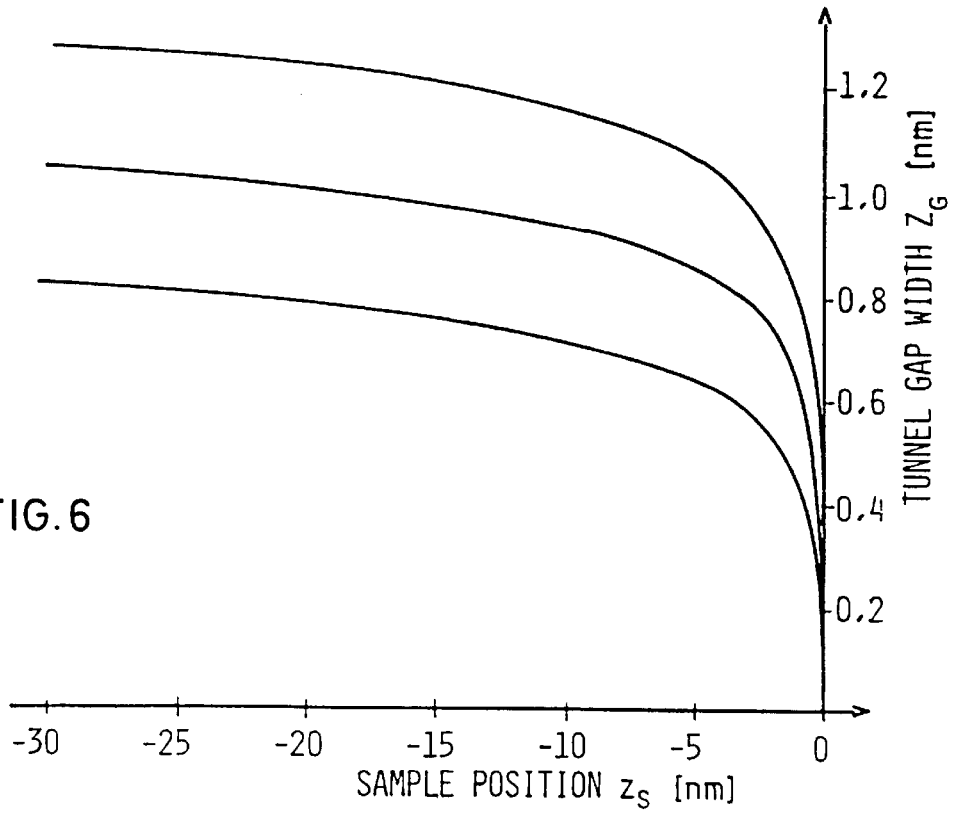
FIG. 6 is a section of the graph of FIG. 5 having a larger scale.
Figure 7:
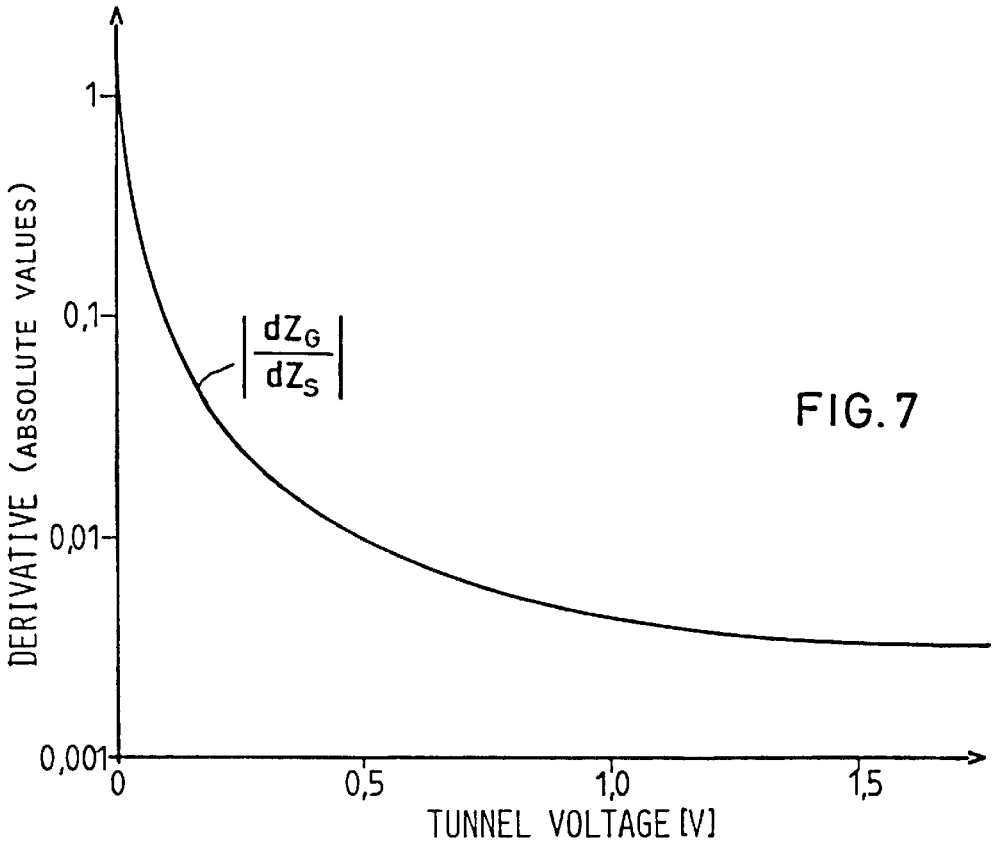
FIG. 7 shows a characteristic of the control circuitry in accordance with the parameters chosen.
Figure 8:
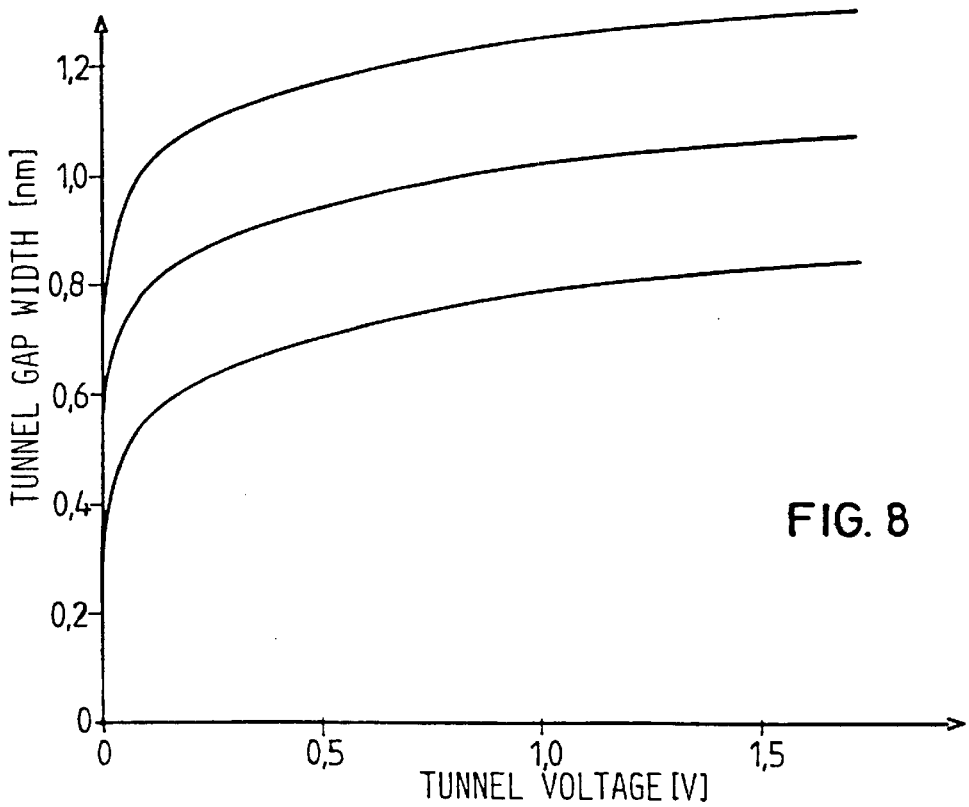
FIG. 8 shows another characteristic of the control circuitry in accordance with the parameters chosen.

The resulting characteristics are shown in FIGS. 6 through 8. FIG. 6 depicts the relevant section of curve d in FIG. 5, namely the relation of tunnel gap width versus sample position, for three values of the tunneling current, viz. 0.1 nA, 1 nA, and 10 nA, at a larger scale. FIG. 7 shows the corresponding relation between $dZ_G/dz_S$ versus $U_t$ which is independent $I_t$. It can be seen that $dZ_G/dz_S$=0.01 in the operating range around $U_t$=0.5 V. FIG. 8 relates the gap width to the tunneling voltage for the three values 0.1 nA, 1 nA and 10 nA of the tunneling current $I_t$.

It will be apparent from the foregoing description that variations in tunneling current occurring fast as compared to the time constant $\tau_L$ of the $R_L$–$C_L$ circuit are not compensated for by the current stabilizer comprising field-effect transistor 11. Small asperities on the surface 6 of the recording medium 7 (topography) as well a local changes in workfunction of the recording material, therefor, will show up in full strength in the tunneling current $I_t$. They create a voltage signal $U_{SIG}$ across load resistance $R_L$ 14 can be wed for further processing of the stored information While the present invention is not directed to the storage medium per se, it seems in order to briefly introduce a storage medium capable of recording variations of the tunneling current. A suitable storage medium may, for example, comprise a thin layer of silicon dioxide on top of a silicon substrate. The oxide is prepared to have a plurality of trapping sites of about 2.4 eV depth. Electrons emitted from a tunnel tip can be stably trapped at such sites at room temperature (cf. D. J. Dimaria in Pantelides (Ed.) "The Physics of SiO2 and is Interfaces", Pergamon 1978, p. 160 et seq.). This mechanism qualifies for write/read applications.

On conventional storage disks, the storage locations are arranged in concentric circles or tracks about a single common center. By contrast, on the storage medium proposed for we in connection with the present invention, the storage locations are arranged in a plurality of identical groups, with all storage positions in any one group being arranged in concentric circles or tracks about the group's own center, and with all centers being arranged in an ordered array on the recording surface of the stage medium. The concentric circles or tracks of storage locations of each group form a "microdisk" with a diameter of less than 0.1 mm. Even with several hundred "microdisks" per recording surface, the area required for a given storage capacity is much smaller than required in any other known storage devices.

The storage medium just described may be attached to the free end of an elongated pizoceramic bendable tube, such as the one known from EP-A-0 247 219, the other end of which is rigidly anchored. Closely adjacent the recording surface at the free end of the tube is mounted the transducer of the present invention with each tunnel tip of its array of tunnel tip being aligned with one of the microdisks. Each tunnel tip faces, and is spaced closely adjacent to, the recording surface on the storage medium. The distance (in the nanometer range) between each tunnel tip ad the recording surface is at the beginning individually adjusted so that each tip normally is at the same preselected tunneling distance from the recording surface 6.

By successively energizing electrode pairs attached to the tube, the free end of the tube and, hence, the recording surface is forced to move in a circular orbit. The diameter of this orbit will vary according to the potential differential that is selected. Thus, the recording surface at the free end of the piezoceramic tube can be caused to move in any one of a plurality of concentric orbits relative to the tunnel tips of the transducer array. As a result, each tip will scan that one of the plurality of concentric circles of tracks of its microdisk corresponding to the selected orbit diameter of the tube. Digital information is written into and/or read out of the storage medium by varying the tunneling current flowing across the gap between the tunnel tip and recording surface.

Recording, therefore, involves addressing and moving a selectable one of the tips 2 in the array of transducer 1 and concurrently energizing the electrode pairs surrounding the tube to a potential corrsponding to an orbit diameter that permits access to a desired one of the concentric tracks on the associated microdisk.

It will be clear to those skilled in the art that several other recording media, as well as other known schemes for the mutual displacement of transducer and/or tunnel tips and recording medium may be employed to achieve the desired result. The important point is that with all those schemes the control circuitry necessary to compensate the variations in the distance between each individual the tunnel tip and the surface of the recording medium is integrated on the transducer.

What is claimed is:

1. A direct access storage unit comprising a recording medium; a plurality of tunnel tips arranged on a transducer in proximity to said recording medium, and means for generating a [mutual] periodic displacement between said recording medium and said transducer, wherein each tip is operated as a detector for the current flowing across a gap ($Z_G$) between said tip and a surface of said recording medium, and wherein each tip is attached to a respective cantilever beam with the [mutual] distance between said tip and the surface of the recording medium being adjustable by electrostatic means, characterized in that each tip is associated with an active control circuit integrated on said transducer in proximity to the respective cantilever beam associated with a particular tip and comprising a transistor, a load resistance, and a capacitance, and that the circuit is connected such that the supply voltage ($U_0$) creating the current across the gap between said tip and the surface of said recording medium also serves to adjust, during operation, the gap distance ($Z_G$) between said tip and the surface of said recording medium.

*2. A direct access storage unit comprising a recording medium, one or more tips arranged on a transducer in proximity to said recording medium, and means for generating a displacement beetween said recording medium and said transducer, wherein each tip is operated as a detector for a current flowing across a gap distance ($Z_g$) between each said tip and a surface of said recording medium, and wherein each tip is attached to a respective cantilever beam with the gap distance ($Z_g$) between each said tip and the surface of the recording medium being adjustable, characterized in that each tip is associated with an active control circuit integrated on said transducer in proximity to the respective cantilever beam associated with the particular tip and comprising a transistor, a load resistance, and a capacitance, and that the circuit is connected such that the supply voltage ($U_0$) creating the current across the gap distance ($Z_g$) between said tip and the surface of said recording medium also serves to adjust, during operation, the gap distance ($Z_g$) between said tip and the surface of said recording medium.*

*3. The direct access storage unit of claim 2, further comprising an electrostatic means for adjusting the gap distance ($Z_g$) between the recording medium and the tip.*

*4. The direct access storage unit of claim 2, further comprising a piezo means for adjusting the gap distance ($Z_g$) between the recording medium and the tip.*

*5. The direct access storage unit of claim 2, wherein the gap distance ($Z_g$) between the recording medium and the tip is less than* 20 nm.

*6. The direct access storage unit of claim 2, wherein the gap distance ($Z_g$) between the recording medium and the tip is less than* 2 nm.

*7. The direct access storage unit of claim 2, wherein the active control circuit comprises an open loop circuit.*

*8. The direct access storage unit of claim 2, wherein the means for generating a displacement allows each tip to scan a plurality of concentric circles of tracks on the surface of the recording medium.*

* * * * *